(12) United States Patent
Tsuchiya et al.

(10) Patent No.: US 11,049,786 B2
(45) Date of Patent: Jun. 29, 2021

(54) SEMICONDUCTOR DEVICE

(71) Applicant: RENESAS ELECTRONICS CORPORATION, Tokyo (JP)

(72) Inventors: Keita Tsuchiya, Tokyo (JP); Shuuichi Kariyazaki, Tokyo (JP); Takashi Kikuchi, Tokyo (JP); Michiaki Sugiyama, Tokyo (JP); Yusuke Tanuma, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 112 days.

(21) Appl. No.: 16/575,045

(22) Filed: Sep. 18, 2019

(65) Prior Publication Data
US 2020/0135607 A1    Apr. 30, 2020

(30) Foreign Application Priority Data
Oct. 24, 2018    (JP) .............................. JP2018-199937

(51) Int. Cl.
*H01L 23/36*    (2006.01)
*H01L 23/40*    (2006.01)
*H01L 23/538*    (2006.01)
*H01L 25/18*    (2006.01)

(52) U.S. Cl.
CPC .............. *H01L 23/36* (2013.01); *H01L 23/40* (2013.01); *H01L 23/5389* (2013.01); *H01L 25/18* (2013.01)

(58) Field of Classification Search
CPC ..... H01L 23/36; H01L 23/40; H01L 23/5389; H01L 25/18

USPC .......................................................... 257/706
See application file for complete search history.

(56) References Cited

U.S. PATENT DOCUMENTS

| | | | |
|---|---|---|---|
| 5,396,403 A * | 3/1995 | Patel ..................... | H01L 23/433 257/713 |
| 7,649,253 B2 | 1/2010 | Sato | |
| 2006/0145316 A1* | 7/2006 | Kim .................... | H01L 23/3128 257/675 |
| 2007/0069370 A1* | 3/2007 | Sato ...................... | H01L 23/367 257/706 |

FOREIGN PATENT DOCUMENTS

JP    2007-095860 A    4/2007

* cited by examiner

*Primary Examiner* — Long K Tran
(74) *Attorney, Agent, or Firm* — McDermott Will & Emery LLP

(57) ABSTRACT

The semiconductor device includes a wiring substrate, a first and second semiconductor chips, and the heat sink. The wiring substrate has a first surface. The first and second semiconductor chips are disposed on the first surface. The heat sink is disposed on the first surface so as to cover the first semiconductor chip. The heat sink has a second surface and the third surface opposite the first surface. The second surface faces the first surface. The heat sink has a first cut-out portion. The first cut-out portion is formed at a position overlapping with the second semiconductor chip in plan view, and penetrates the heat sink in a direction from the third surface toward the second surface. The second surface is joined to at least four corners of the first surface.

15 Claims, 17 Drawing Sheets

SEMICONDUCTOR DEVICE

CROSS-REFERENCE TO RELATED APPLICATIONS

The disclosure of Japanese Patent Application No. 2018-199937 filed on Oct. 24, 2018 including the specification, drawings and abstract is incorporated herein by reference in its entirety.

BACKGROUND OF THE INVENTION

The present invention relates to a semiconductor device.

In Japanese Unexamined. Patent Application No. 2007-95860, a semiconductor device is disclosed a substrate, a first semiconductor chip, a second semiconductor chip, and a heat sink.

The first semiconductor chip and the second semiconductor chip are arranged on the substrate.

The first semiconductor chip is disposed at the center of the substrate in plan view, and the second semiconductor chip is disposed at four corners of the substrate in plan view.

The upper surface of the second semiconductor chip is located farther from the surface of the substrate than the upper surface of the first semiconductor chip.

The heat sink has a cross-shaped shape in plan view.

That is, the heat sink covers the first semiconductor chip, but does not cover the second semiconductor chip.

The first semiconductor chip and the heat sink are bonded to each other with an adhesive.

SUMMARY OF THE INVENTION

In the semiconductor device described in Japanese Patent Application No. 2018-199937, the heat sink covers the first semiconductor chip, but does not cover the second semiconductor chip, so that the thickness of the adhesive is not affected by the height of the second semiconductor chip.

Therefore, in the semiconductor device described in Japanese Patent Application No. 2018-199937, the thickness of the adhesive can be made relatively thin, and the heat radiation efficiency from the first semiconductor chip to the heat sink can be increased.

However, in the semiconductor device described in Japanese Patent Application No. 2018-199937, since the heat sink plate is bonded only to the first semiconductor chip, there is room for improvement in warpage of the substrate.

Other objects and novel features will become apparent from the description of this specification and the accompanying drawings.

The semiconductor device according to the embodiment includes a wiring substrate, a first semiconductor chip, a second semiconductor chip, and the heat sink.

The wiring substrate has a first surface.

The first semiconductor chip and the second semiconductor chip are disposed on the first surface.

The heat sink is disposed on the first surface so as to cover the first semiconductor chip.

The heat sink has a second surface and a third surface.

The second surface faces the first surface.

The third surface is the opposite surface of the second surface.

The heat sink has a first cut-out portion.

The first cut-out portion is formed at a position overlapping with the second semiconductor chip in plan view, and penetrates the heat sink in a direction from the third surface toward the second surface.

The second surface is bonded to at least four corners of the first surface.

According to the semiconductor device of the embodiment, it is possible to improve the heat dissipation efficiency from the first semiconductor chip to the heat sink while suppressing warpage of the wiring substrate.

DESCRIPTIONS OF THE PREFERRED EMBODIMENTS

Figure 1:
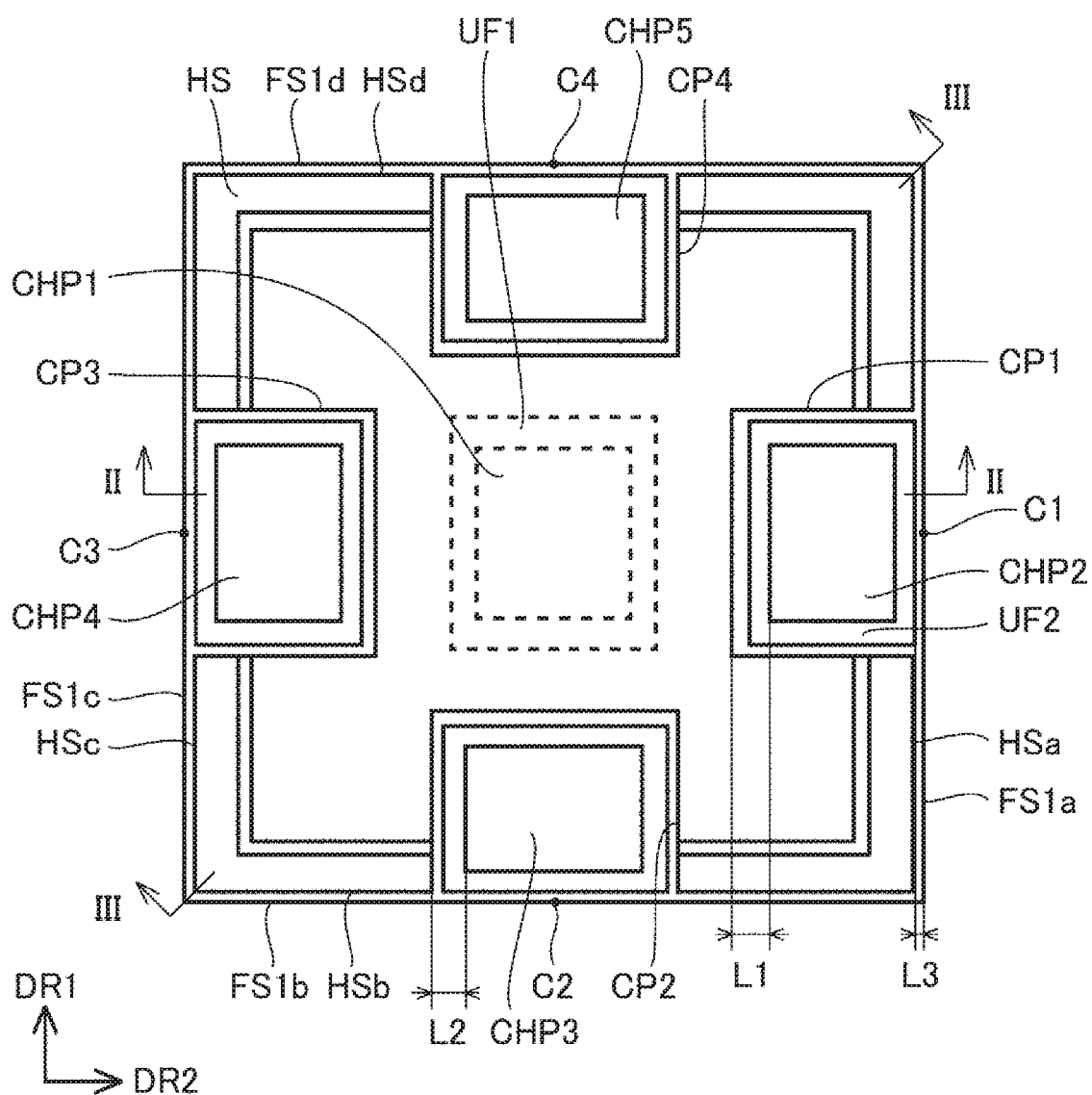
FIG. 1 is a plan view of a semiconductor device according to a first embodiment.

In the following drawings, the same or corresponding parts are denoted by the same reference numerals, and the description thereof will not be repeated.

At least some of the embodiments described below may be arbitrarily combined.

Hereinafter, a configuration of a semiconductor device according to a first embodiment will be described.

Figure 2:
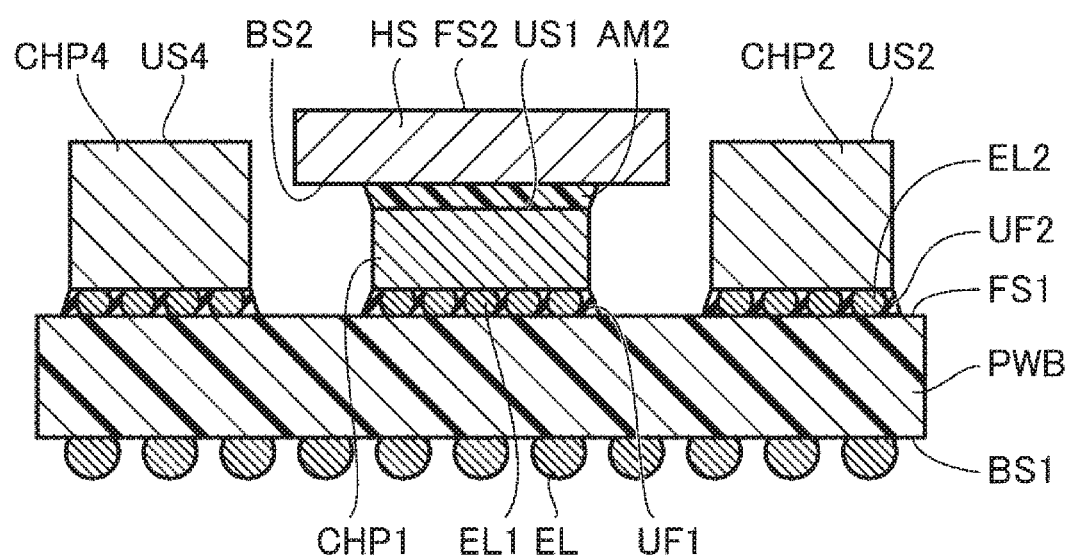
FIG. 2 is a cross-sectional view taken along line II-II of FIG. 1.
Figure 3:
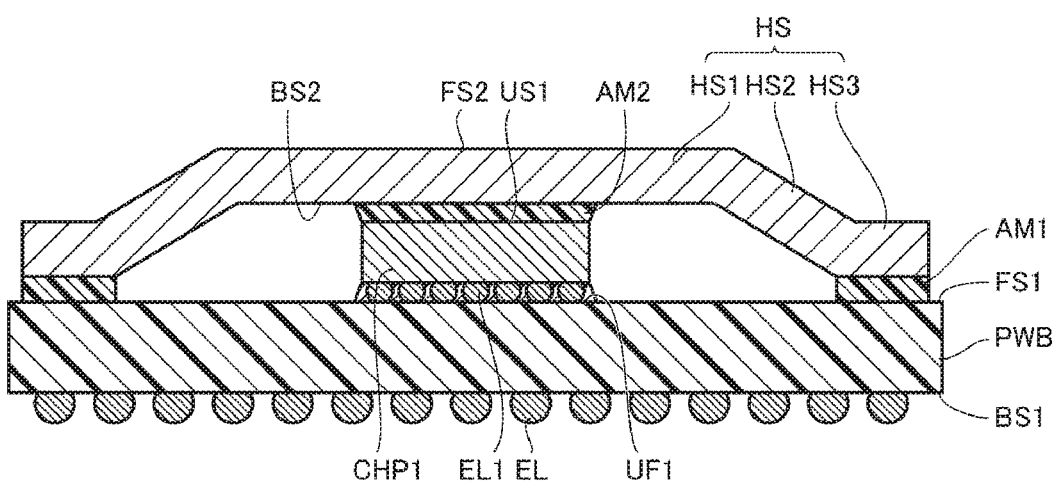
FIG. 3 is a cross-sectional view takes along line III-III of FIG. 1.

As shown in FIGS. 1, 2, and 3, the semiconductor device according to the first embodiment includes a wiring substrate PWB, a semiconductor chip CHP1, semiconductor chips CHP2 to CHP5, and a heat sink HS.

The wiring substrate PWB has a top surface FS1 and a back surface BS1. The back BS1 is the other side of the top surface t FS1. External connecting electrodes EL are formed on the back surface BS1. External connection electrodes EL are formed of, for example, solder balls. The wiring substrate PWB is, for example, a printed wiring board. The top surface FS1 has a rectangular shape in plan view, as seen from a direction perpendicular to the top surface FS1.

The top surface FS1 has a first side FS1a, a second side FS1b, a third side FS1c, and a fourth side FS1d. The first to fourth sides FS1a to FS1d constitute the outer periphery of the top surface FS1. The first side FS1a extends in the first direction DR1. The second side FS1b extends in the second direction DR2. The second side FS1b is connected to the first side FS1a at one end. The second side FS1b is connected to the third side FS1c at the other end.

The third side FS1c extends in the first direction DR1. The first side FS1a and the third side FS1c are opposed to each other. The fourth side FS1d extends in the second direction DR2. The second side FS1b and the fourth side FS1d are opposed to each other. The fourth side FS1d is connected to the third side FS1c at one end. The fourth side FS1d is connected to the first side FS1a at the other end.

The first direction DR1 and the second direction DR2 intersect each other. Preferably, the first direction DR1 and the second direction DR2 are perpendicular to each other. The center of the first side FS1a, the center of the second side FS1b, the center of the third side FS1c, and the center of the fourth side FS1d are referred to as the center C1, the center C2, the center C3, and the center C4, respectively.

The semiconductor chip CHP1 is disposed on the top surface FS1. More specifically, the semiconductor chip CHP1 has a plurality of electrodes EL1. The electrodes EL1 are formed of, for example, solder balls. The electrodes EL1 are formed on the circuit-forming surface of the semiconductor chip CHP1.

The semiconductor chip CHP1 has a rectangular shape in plan view. The semiconductor chip CHP1 is disposed at the center of the wiring substrate PWB in plan view. More specifically, in plan view, the center of the semiconductor chip CHP1 coincides with the intersection of the straight line connecting the center C1 and the center C3, and the straight line connecting the center C2 and the center C4.

The semiconductor chip CHP1 is connected to the wiring substrate PWB by the electrodes EL1. The semiconductor chip CHP1 is a bare chip. That is, the semiconductor chip CHP1 is mounted on the wiring substrate by a flip-chip mounting method.

The semiconductor chip CHP1 includes, for example, logic circuits.

The semiconductor chip CHP1 has an upper surface US1, i.e., a first upper surface of the semiconductor chip CHP1. An underfill UF1 is filled between the semiconductor chip CHP1 and the wiring substrate PWB. As a result, the connections between the semiconductor chip CHP1 and the wiring substrates PWBs are reinforced. The underfill UF1 is formed of, for example, an insulating resin material.

The semiconductor chip CHP2 is disposed on the top surface FS1. More specifically, the semiconductor chip CHP2 has a plurality of electrodes EL2. The electrodes EL2 are formed of, for example, solder balls.

The semiconductor chip CHP2 is connected to the wiring substrate PWB by the electrodes EL2. The semiconductor chip CHP2 is a Ball Grid Array in which electrodes EL2 are arranged in a matrix, and the semiconductor chip CHP2 is sealed with resin. The semiconductor chip CHP2 includes memory circuits (flash memory, Dynamic Random Access Memory (DRAM), and the like). The power consumption (calorific value) of the semiconductor chip CHP2 is smaller than the power consumption (calorific value) of the semiconductor chip CHP1.

An underfill UF2 is filled between the semiconductor chip CHP2 and the wiring substrate PWB. As a result, the connections between the chips CHP2 and the wiring substrates PWBs are reinforced. The underfill UF2 is formed of, for example, an insulating resin material.

The semiconductor chip CHP2 has an upper surface US2, i.e., a second upper surface US2 of the semiconductor chip CHP2. The upper surface US2 is located more distant from the wiring substrate PWB (from the top surface FS1) than the first upper surface US1.

The semiconductor chip CHP2 has a rectangular shape in plan view. The semiconductor chip CHP2 is disposed around the semiconductor chip CHP1 in plan view. More specifically, the semiconductor chip CHP2 is disposed between the first side FS1a and the semiconductor chip CHP1 in plan view. In plan view, the position of the center of the semiconductor chip CHP2 in the first direction DR1 coincides with the position of the center of the semiconductor chip CHP2 in the first direction DR1 of the center C1.

Configuration of Semiconductor Chips CHP3 to CHP5

A semiconductor chip CHP3 is positioned around the semiconductor chip CHP1 in plan view. More specifically, the semiconductor chip CHP3 is disposed between the second side FS1b and the semiconductor chip CHP1 in plan view. In plan view, the position of the center of the semiconductor chip CHP3 in the second direction DR2 coincides with the position of the center of the semiconductor chip CHP3 in the second direction DR2 of the center C2.

The semiconductor chip CHP4 is disposed around the semiconductor chip CHP1 in plan view. More specifically, the semiconductor chip CHP4 is disposed between the third side FS1c and the semiconductor chip CHP1 in plan view. In plan view, the position of the center of the semiconductor chip CHP4 in the first direction DR1 coincides with the position of the center of the semiconductor chip CHP4 in the first direction DR1 of the center C3.

The semiconductor chip CHP5 is disposed around the semiconductor chip CHP1 in plan view. More specifically, the semiconductor chip CHP5 is disposed between the fourth side FS1d and the semiconductor chip CHP1 in plan view. In plan view, the position of the center of the semiconductor chip CHP4 in the second direction DR2 coincides with the position of the center of the semiconductor chip CHP4 in the second direction DR2 of the center C4.

Since the remaining configurations of the semiconductor chip CHP3, the semiconductor chip CHP4, and the semiconductor chip CHP5 are the same as those of the semiconductor chip CHP2, their descriptions are omitted. The upper surfaces of the semiconductor chip CHP3 to CHP5 are defined as an upper surface US3 to an upper surface US5, respectively.

The heat sink HS has a top surface FS2 (third surface) and a back surface BS2 (second surface). The back surface BS2 faces the top surface FS1. The top surface FS2 is the other surface of the back surface BS2. The heat sink HS is formed of, for example, a copper (Cu) alloy. The heat sink HS may be formed of an aluminum (Al) alloy. The heat sink HS is formed by, for example, punching or drawing a plate-like member.

The heat sink HS has a rectangular shape in plan view. The heat sink HS has, in plan view, a fifth side HSa, a sixth side HSb, a seventh side HSc, and an eighth side HSd. The fifth side HSa to the eighth side HSd constitute the outer periphery of the heat sink HS in plan view. The outer surface of the heat sink HS in plan view is located inside the outer periphery of the wiring substrate PWB on the top surface FS1 of the wiring substrate PWB.

The fifth side HSa extends in the first direction DR1. The sixth side HSb extends in the second direction DR2. The sixth side HSb is connected to the fifth side HSa at one end. The sixth side HSb is connected to the seventh side HSc at the other end.

The seventh side HSc extends in the first direction DR1. The seventh side HSc faces the fifth side HSa. The eighth side HSd extends in the second direction DR2. The eighth side HSd faces the sixth side HSb. The eighth side HSd is connected to the seventh side HSc at one end. The eighth side HSd is connected to the fifth side HSa at the other end.

In the heat sink HS, the fifth side HSa, the sixth side HSb, the seventh side HSc, and the eighth side HSd are arranged along the first side FS1a, the second side FS1b, the third side FS1c, and the fourth side FS1d, respectively.

The heat sink HS includes a first portion HS1, a second portion HS2, and a third portion HS3. The second portion HS2 is formed so as to surround the first portion HS1 in plan view. The third portion HS3 is formed so as to surround the second portion HS2 in plan view. The distance between the back surface BS2 and the top surface FS1 in the first portion HS1 is greater than the distance between the back surface BS2 and the top surface FS1 in the third portion HS3. The distance between the back surface BS2 and the top surface FS1 in the second portion HS2 increases from the third portion HS3 side toward the first portion HS1 side.

The back surface BS2 in the first portion HS1 is located closer to the top surface FS1 than the upper surface US2 (upper surface US3 to upper surface US5). That is, the distance between the back surface BS2 and the top surface FS1 in the first portion HS1 is smaller than the distance between the upper surface US2 (upper surface US3 to upper surface US5) and the top surface FS1.

The back surface BS2 on the third portion HS3 is bonded to the peripheral portion of the top surface FS1 by an adhesive member AM1. The back surface BS2 in the third portion HS3 may be bonded to at least four corners of the top surface FS1.

The back surface BS1 on the first portion HS1 is bonded to the upper surface US1 by an adhesive member AM2 (the second adhesive member). The thermal conductivity of the adhesive member AM2 is greater than the thermal conductivity of the adhesive member AM1. The adhesive member AM1 is formed of, for example, an epoxy-based adhesive. The adhesive member AM2 is formed, for example, by mixing filler particles with an epoxy-based adhesive. The filler particles are metal or ceramic particles.

The heat sink HS has a cut-out portion CP1, a cut-out portion CP2, a cut-out portion CP3, and a cut-out portion CP4 formed in the heat sink HS. The cut-out portions CP1 to CP4 have a rectangular shape in plan view. The cut-out portions CP1 to CP4 penetrate the heat sink HS in the thickness direction (in the direction from the top surface FS2 to the back surface BS2).

The cut-out portion CP1 extends from the fifth side HSa to the seventh side HSc in plan view. The cut-out portion CP2 extends from the sixth side HSb to the eighth side HSd in plan view. The cut-out portion CP3 extends from the seventh side HSc to the fifth side HSa in plan view. The cut-out portion CP4 extends from the eighth side HSd to the sixth side HSb in plan view.

The cut-out portion CP1 is formed so as to overlap with the semiconductor chip CHP2 in plan view. The cut-out portion CP2 is formed so as to overlap with the semiconductor chip CHP3 in plan view. The cut-out portion CP3 is formed so as to overlap with the semiconductor chip CHP4 in plan view. The cut-out portion CP4 is formed so as to overlap with the semiconductor chip CHP5 in plan view. The cut-out portions CP1 to CP4 are formed, for example, by punching the heat sink HS.

That is, the heat sink HS covers the semiconductor chip CHP1, but does not cover the semiconductor chips CHP2 to CHP5. As a result, even if the back surface BS2 in the first portion HS1 is located at a position closer to the top surface FS1 than the upper surface US2 (upper surface US3 to upper surface US5), the heat sink HS and the top surface US2 do not touch each other.

The distance between the end of the cut-out portion CP1 on the seventh side HSc and the end of the semiconductor chip CHP2 on the third side FS1c is defined as a distance L1. The distance between the end of the cut-out portion CP2 on the seventh side HSc side and the end of the semiconductor chip CHP3 on the third side FS1c side is defined as a distance L2. The distance between the first side FS1a and the fifth side HSa is defined as a distance L3. The distance L1 and the distance L2 are greater than the distance L3.

Figure 4:
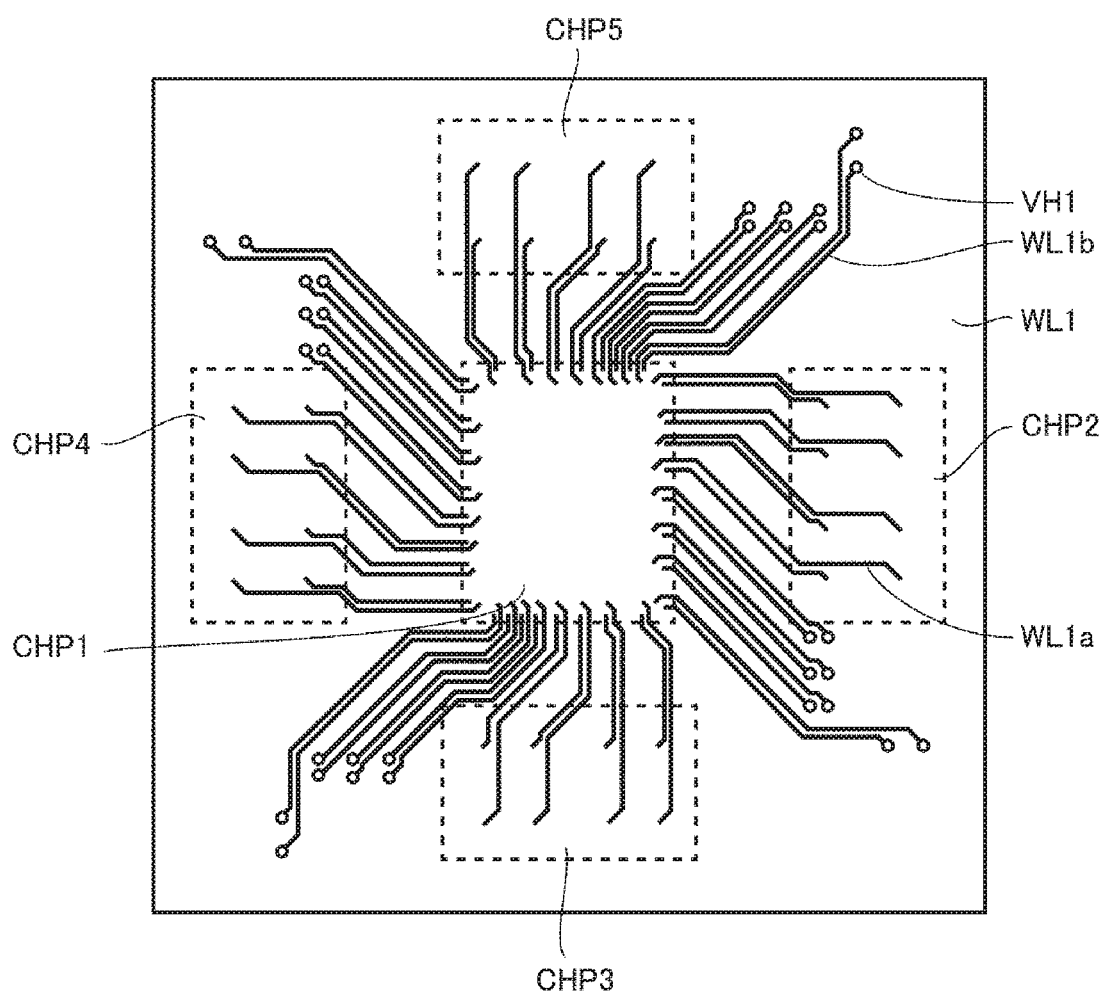
FIG. 4 is a top view of a wiring layer WL1 of the semiconductor device according to a first embodiment.
Figure 5:
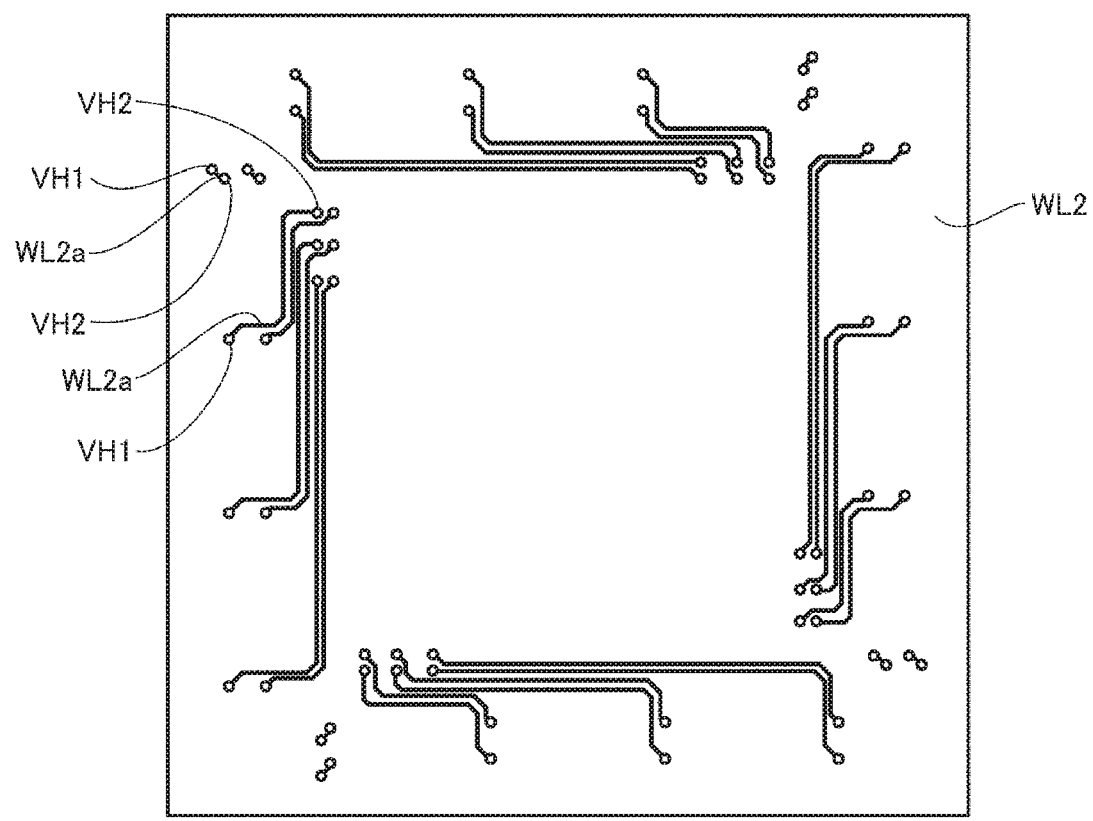
FIG. 5 is a top view of a wiring layer WL2 of the semiconductor device according to the first embodiment.

As shown in FIGS. 4 and 5, the wiring substrate PWB includes a wiring layer WL1 and a wiring layer WL2. That is, the wiring substrate PWB is a multilayer wiring substrate. The wiring layer WL1 is disposed closer to the top surface FS1 than the wiring layer WL2. In FIG. 4, the outlines of the semiconductor chips CHP1 to CHP5 are indicated by dotted lines.

As shown in FIG. 4, the wiring layers WL1 have a wiring WL1a and a wiring WL1b. As shown in FIG. 5, the wiring layers WL2 have a wiring WL2a.

The wiring WL1a connects the semiconductor chip CHP1 and the semiconductor chips CHP1 to CHP5. The wiring WL1b connects the semiconductor chip CHP1 and the via hole VH1. The wiring WL1b is formed so as not to intersect the wiring WL1a in plan view. The via hole VH1 connects the wiring WL1b and the wiring WL2a. The wiring WL2a is connected to the via hole VH2. The via holes VH2 are connected to the external connecting electrodes EL.

Figure 6:
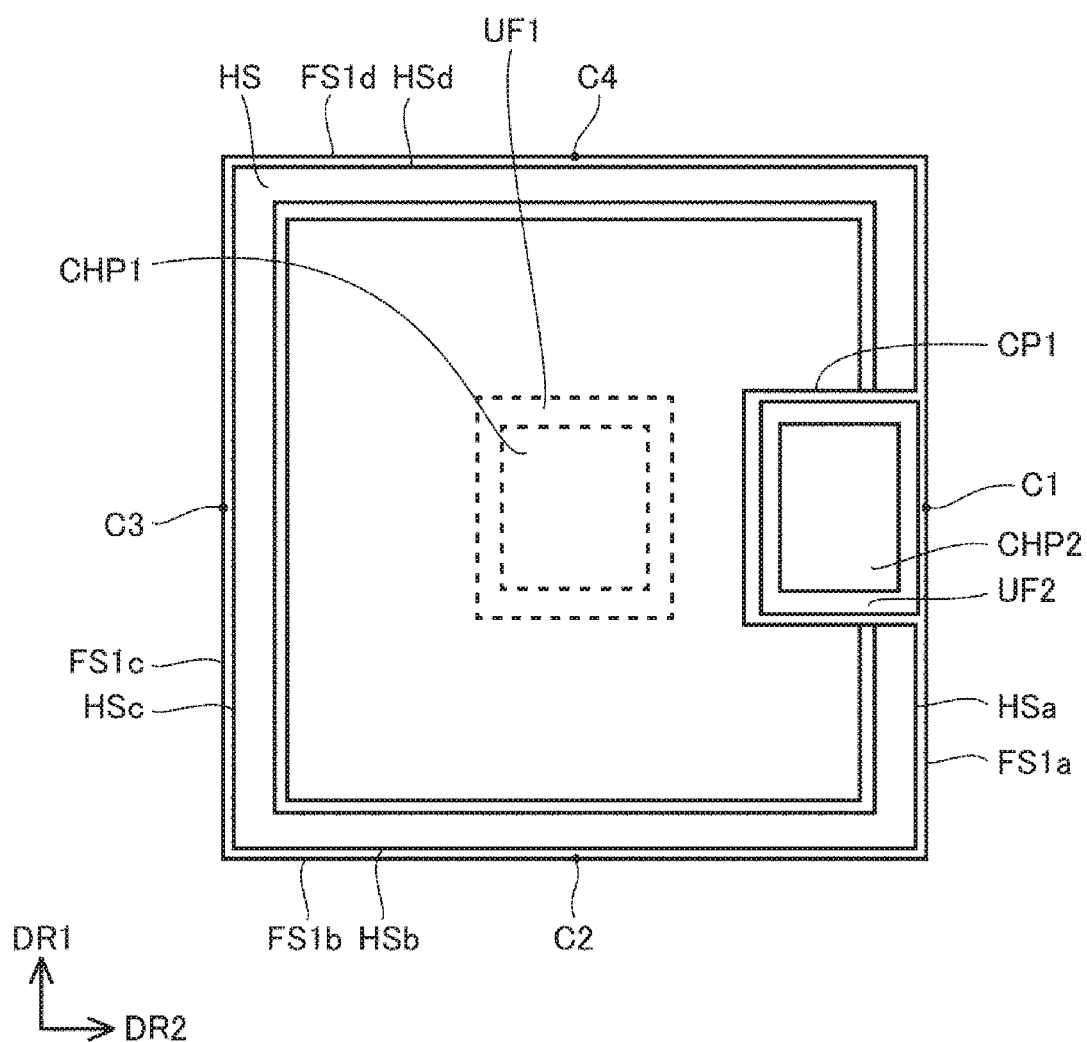
FIG. 6 is a top view of a semiconductor device according to a first modification of the first embodiment.

The semiconductor device according to the first embodiment does not need to have all of the semiconductor chips CHP2 to CHP5. For example, as shown in FIG. 6, the semiconductor device according to the first embodiment may not have the semiconductor chips CHP3 to CHP5. In this instance, the cut-out portions CP2 to CP4 may not be formed in the heat sink HS.

Figure 7:
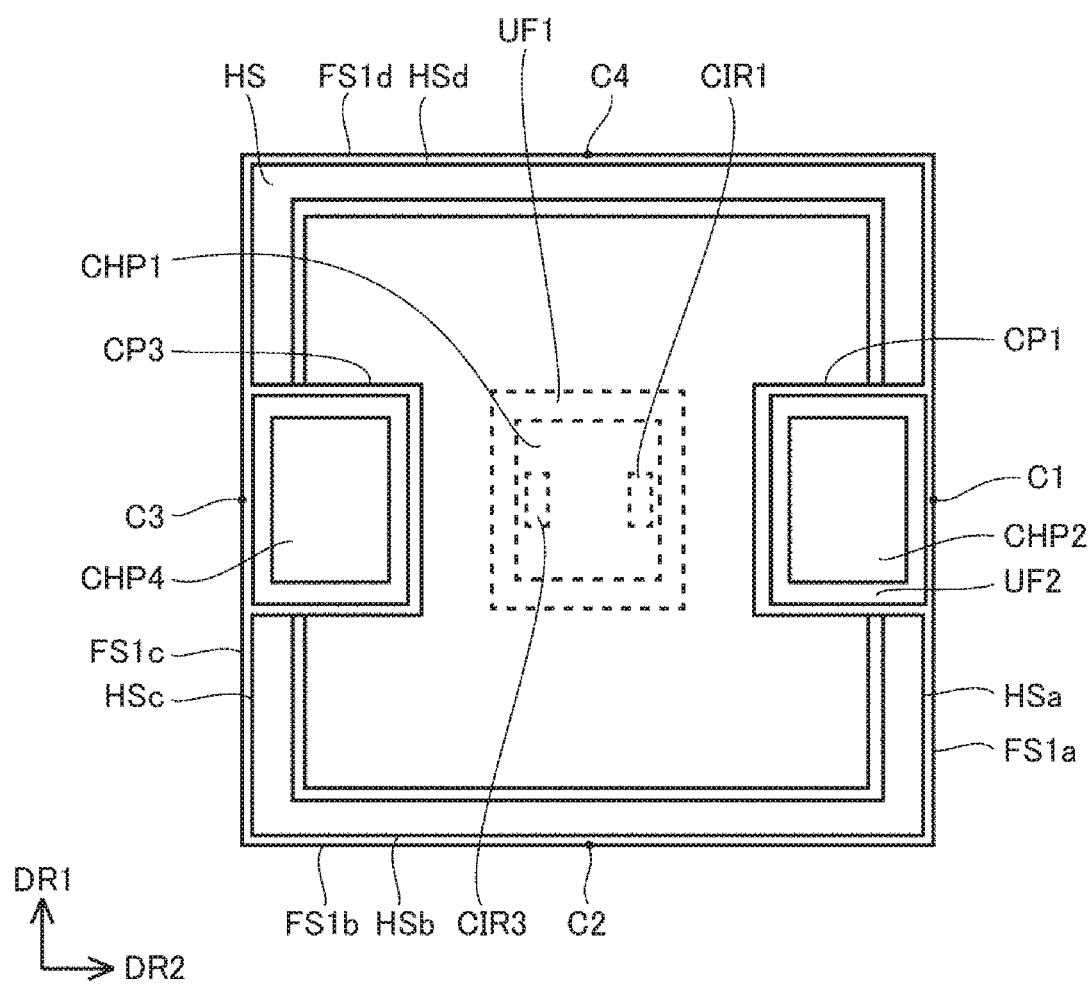
FIG. 7 is a top view of a semiconductor device according to a second modification of the first embodiment.

Semiconductor Device According to the Second Modification of the First Embodiment As shown in FIG. 7, the semiconductor device according to the first embodiment may not have a semiconductor chip CHP3 and a semiconductor chip CHP5. In this instance, the cut-out portion CP2 and the cut-out portion CP4 may not be formed in the heat sink HS. That is, two semiconductor chips disposed around the semiconductor chip CHP1 may be disposed so as to face each other with the semiconductor chip CHP1 interposed therebetween.

Figure 8:
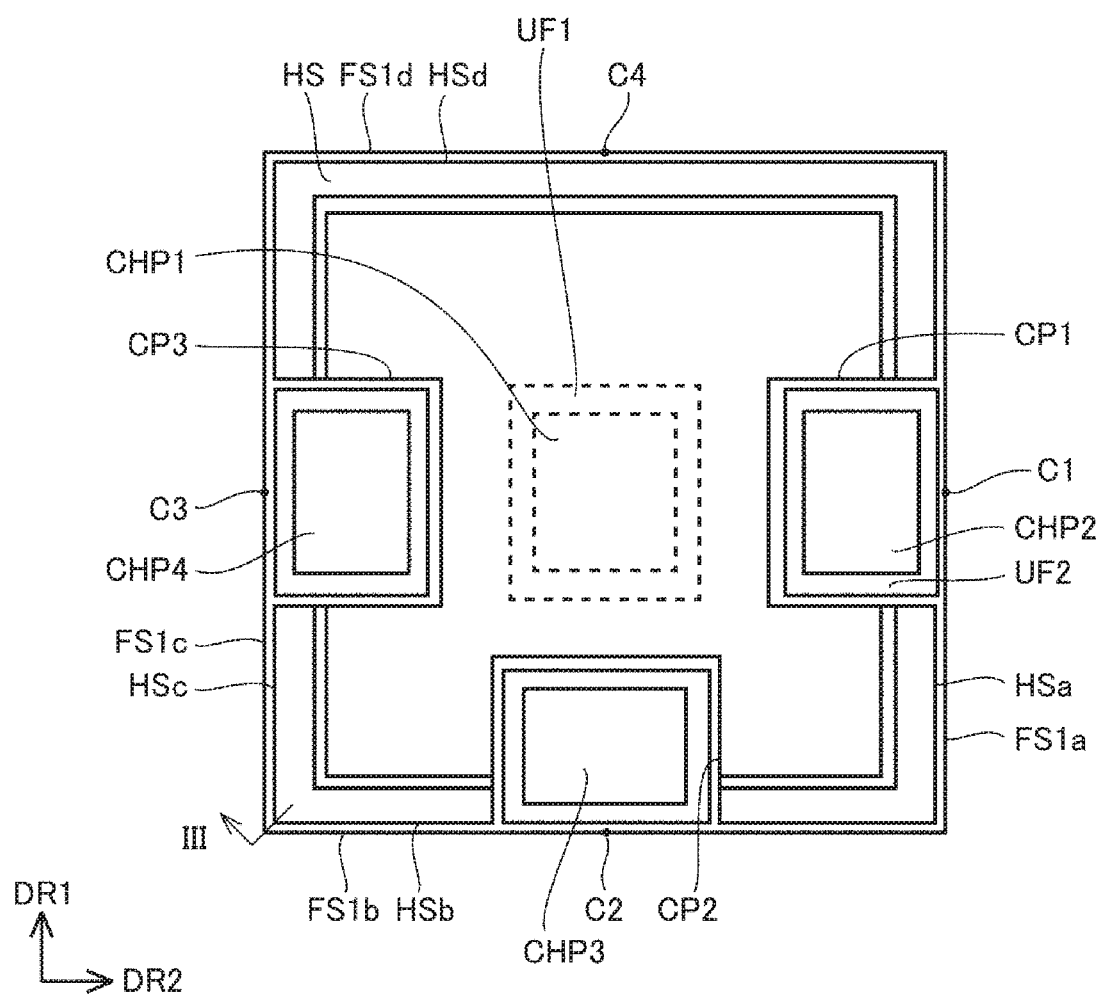
FIG. 8 is a top view of a semiconductor device according to a third modification of the first embodiment.

Semiconductor Device According to the Third Modification of the First Embodiment As shown in FIG. 8, the semiconductor device according to the first embodiment may not have a semiconductor chip CHP5. In this instance, the cut-out portion CP4 may not be formed in the heat sink HS.

Hereinafter, an effect of the semiconductor device according to the first embodiment will be described in comparison with a comparative example.

In the semiconductor device according to the first comparative example, the back surface BS2 of the semiconductor device in the third portion HS3 is bonded to at least four corners of the top surface FS1. Therefore, in the semiconductor device according to the first comparative example, warpage of the wiring substrate PWB is suppressed by the heat sink HS.

Figure 9:
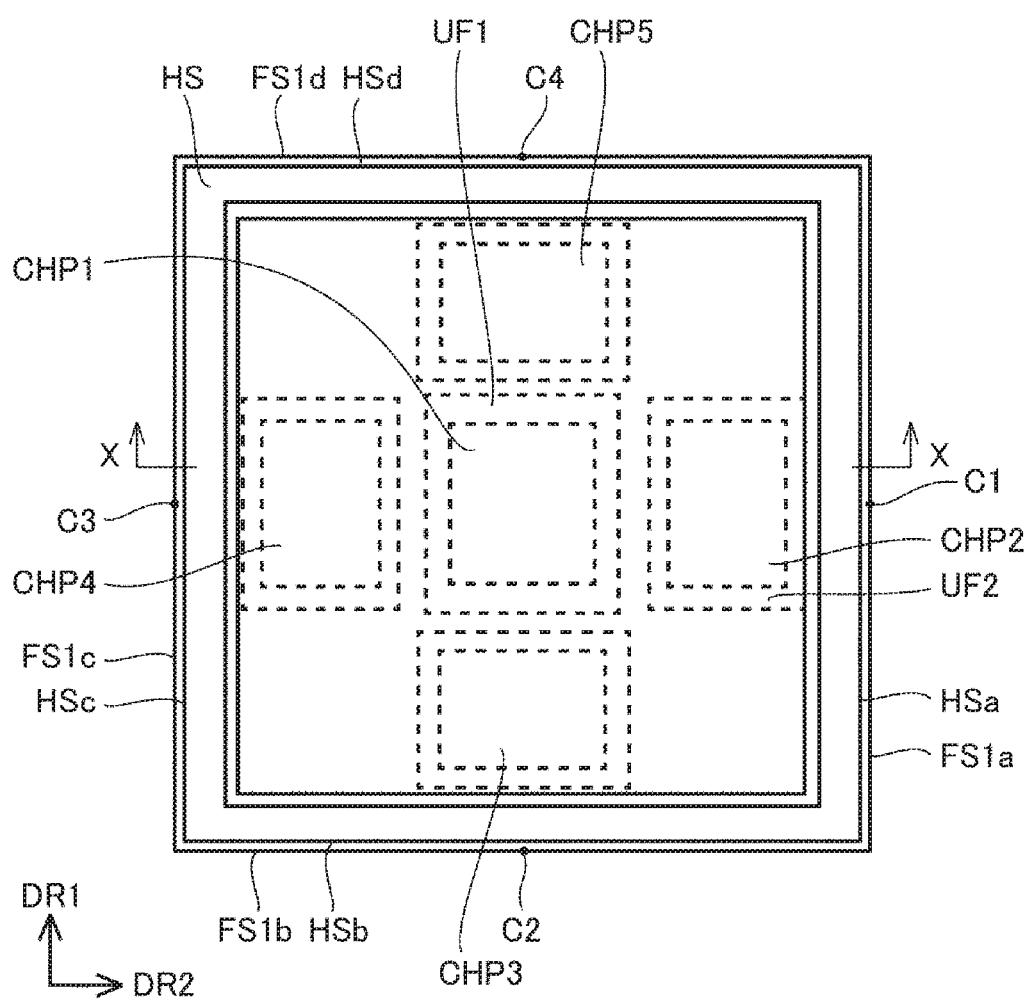
FIG. 9 is a top view of a semiconductor device according to a first comparative example.
Figure 10:
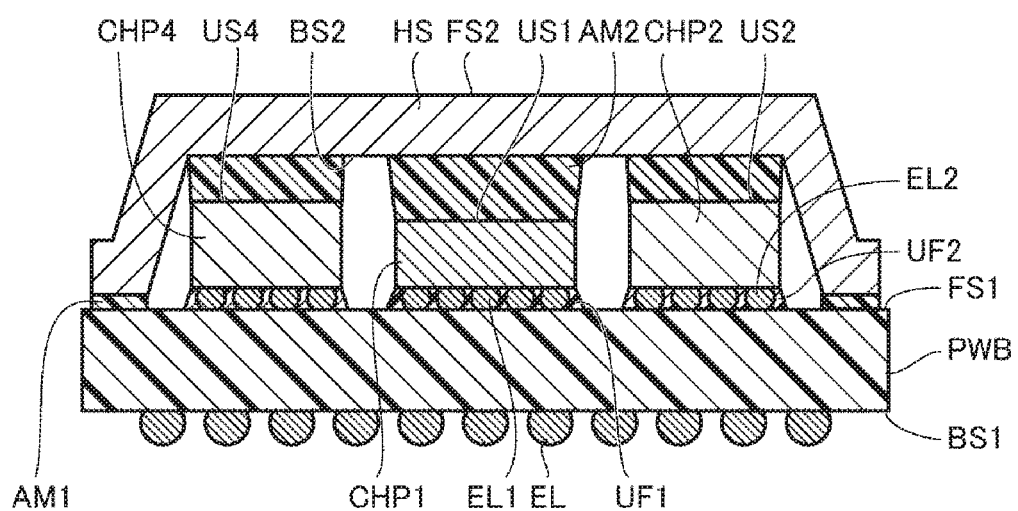
FIG. 10 is a cross-sectional view taken along line X-X in FIG. 9.

However, as shown in FIGS. 9 and 10, in the semiconductor device according to the first comparative example, the cut-out portions CP1 to CP4 are not formed in the semiconductor device according to the first comparative example. That is, in the semiconductor device according to the first comparative example, the distance between the back surface BS2 and the top surface FS1 in the first portion HS1 needs to be large so that the heat radiating plate HS (the first portion HS1) and the upper surface US2 (the upper surface US3 to the upper surface US5) do not touch each other. As a result, the distance between the back surface BS2 and the upper surface US1 of the first portion HS1 is increased (the adhesive member AM2 is also increased) and the heat dissipation efficiency from the semiconductor chip CHP1 to the heat sink HS is decreased.

Figure 11:
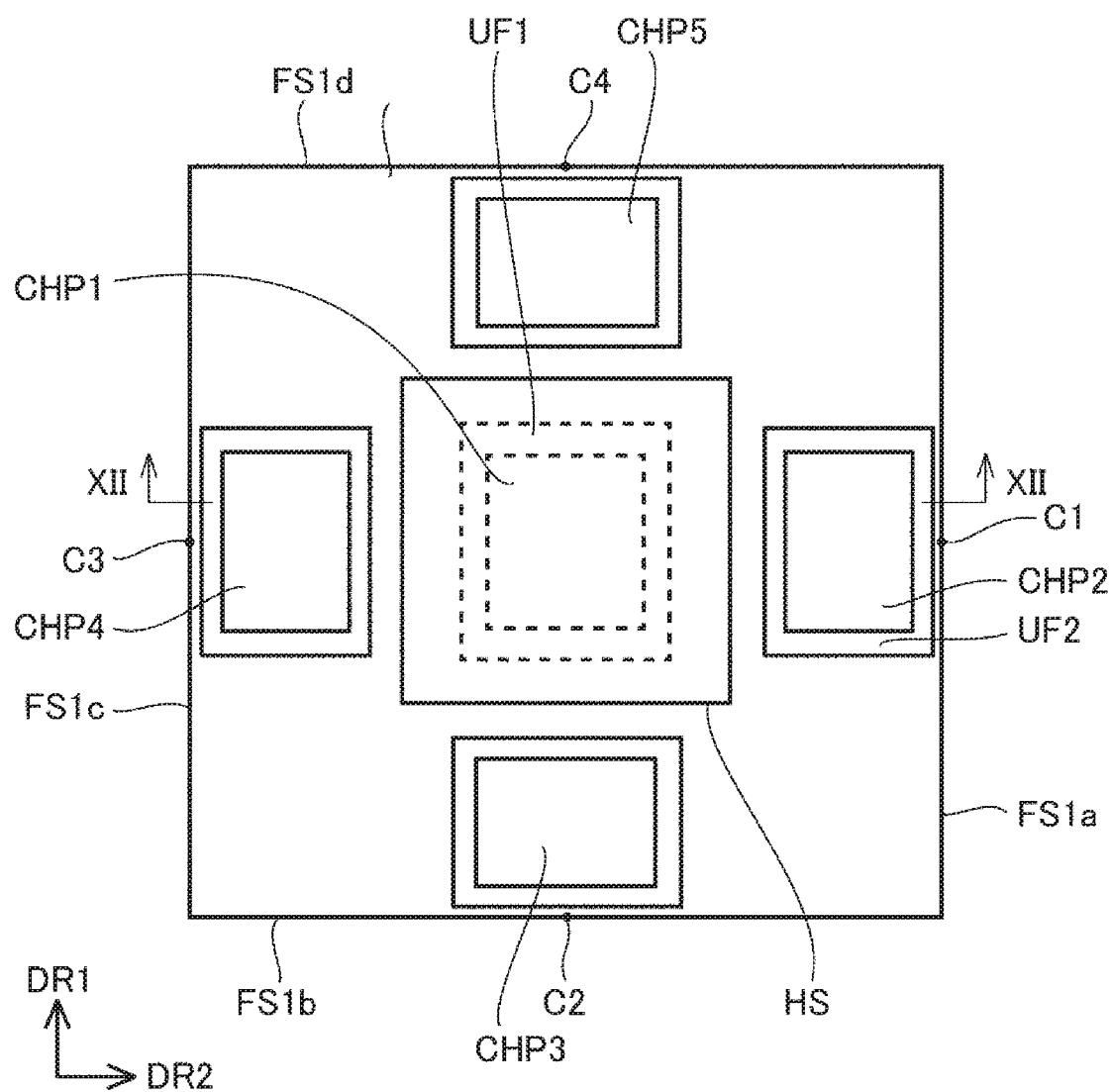
FIG. 11 is a top view of a semiconductor device according to a second comparative example.
Figure 12:
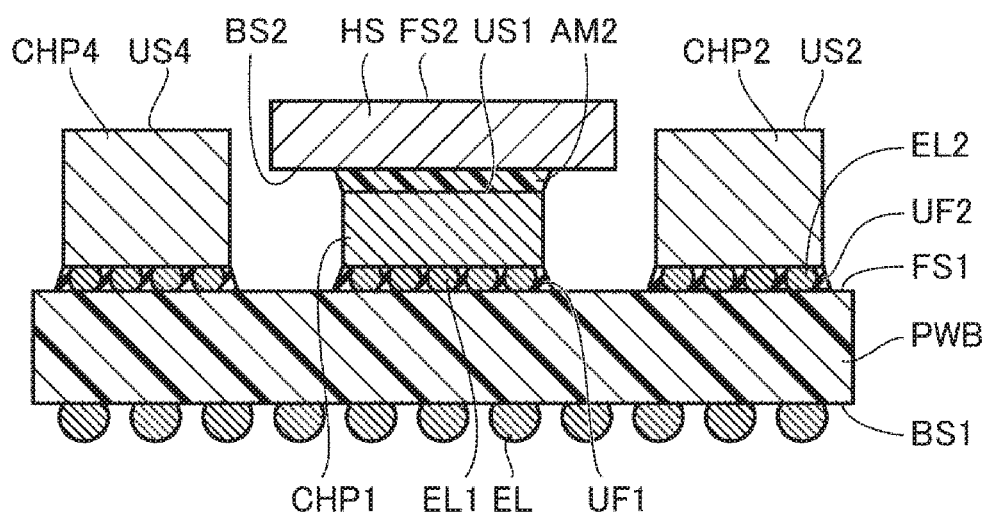
FIG. 12 is a cross-sectional view taken along line XII-XII of FIG. 11.

As shown in FIGS. 11 and 12, in the semiconductor device according to a second comparative example, the heat sink HS covers the semiconductor chip CHP1, but has a rectangular shape that does not cover the semiconductor chips CHP2 to CHP5. Therefore, in the semiconductor device according to the second comparative example, since the heat sink HS and the upper surface US2 (upper surface US3 to upper surface US5) do not contact each other, the adhesive member AM2 can be thinned.

However, in the semiconductor device according to the second comparative example, since the heat sink plate HS is fixed only by the adhesive member AM2, it is difficult to use an adhesive member having a high thermal conductivity for the adhesive member AM2. This is because there is a trade-off relationship between the thermal conductivity of the adhesive member and the bonding strength of the adhesive member.

As a result, in the semiconductor device according to the second comparative embodiment, the heat dissipation efficiencies from the semiconductor chips CHP1 to the heat sink HS are reduced. Further, in the semiconductor device according to the second comparative example, since the heat sink HS is not bonded to the four corners of the top surface FS1, the warpage of the wiring substrate PWB cannot be suppressed by the heat sink HS.

In the semiconductor device according to the first embodiment, since the cut-out portions CP1 to CP4 are formed in the heat sink HS, the heat sink HS (the first portion HS1) and the upper surface US2 (the upper surface US3 to the upper surface US5) do not contact each other even if the distance between the back surface BS2 and the upper surface US1 in the first portion HS1 is reduced (even if the adhesive member AM2 is thinned). Therefore, according to the semiconductor device of the first embodiment, it is possible to improve the heat dissipation efficiency from the semiconductor chip CHP1 to the heat sink HS.

In addition, in the semiconductor device according to the first embodiment, since the back surface BS2 of the semiconductor device in the third portion HS3 is bonded to at least four corners of the top surface FS1, warpage of the wiring substrate PWB can be suppressed by the heat sink HS. As described above, according to the semiconductor device of the first embodiment, it is possible to improve the heat dissipation efficiency from the semiconductor chip CHP1 to the heat sink HS while suppressing the warpage of the wiring substrate PWB. Further, in the semiconductor device according to the first embodiment, since the adhesive member AM2 can be selected with the thermal conductivity being more important than the bonding strength, the heat dissipation efficiency from the semiconductor chip CHP1 to the heat sink HS can be enhanced.

In the semiconductor device according to the first embodiment, when the distance L1 and the distance L2 are greater than the distance L3, even if the heat sink HS is arranged to be maximally shifted in the second direction DR2, it is possible to suppress the heat sink HS from contacting the semiconductor chips CHP2 to CHP5.

Second Embodiment

The configuration of a semiconductor device according to a second embodiment will be described below. It should be noted that in the following description, points different from the configuration of the semiconductor device according to the first embodiment will be mainly described, and description thereof will not be repeated.

The semiconductor device according to the second embodiment includes a wiring substrate PWB, a semiconductor chip CHP1, semiconductor chips CHP2 to CHP5, a heat sink HS, an adhesive member AM1, and an adhesive member AM2. The heat sink HS (third portion HS3) is bonded to at least four corners of the top surface FS1 of the heat sink HS by an adhesive member AM1. The upper surface US1 is bonded to the heat sink HS1 with an adhesive member AM2. The cut-out portion CP1 to the cut-out portion CP4 are formed in the heat sink HS. In these respects, the configuration of the semiconductor device according to the second embodiment is common to the configuration of the semiconductor device according to the first embodiment.

Figure 13:
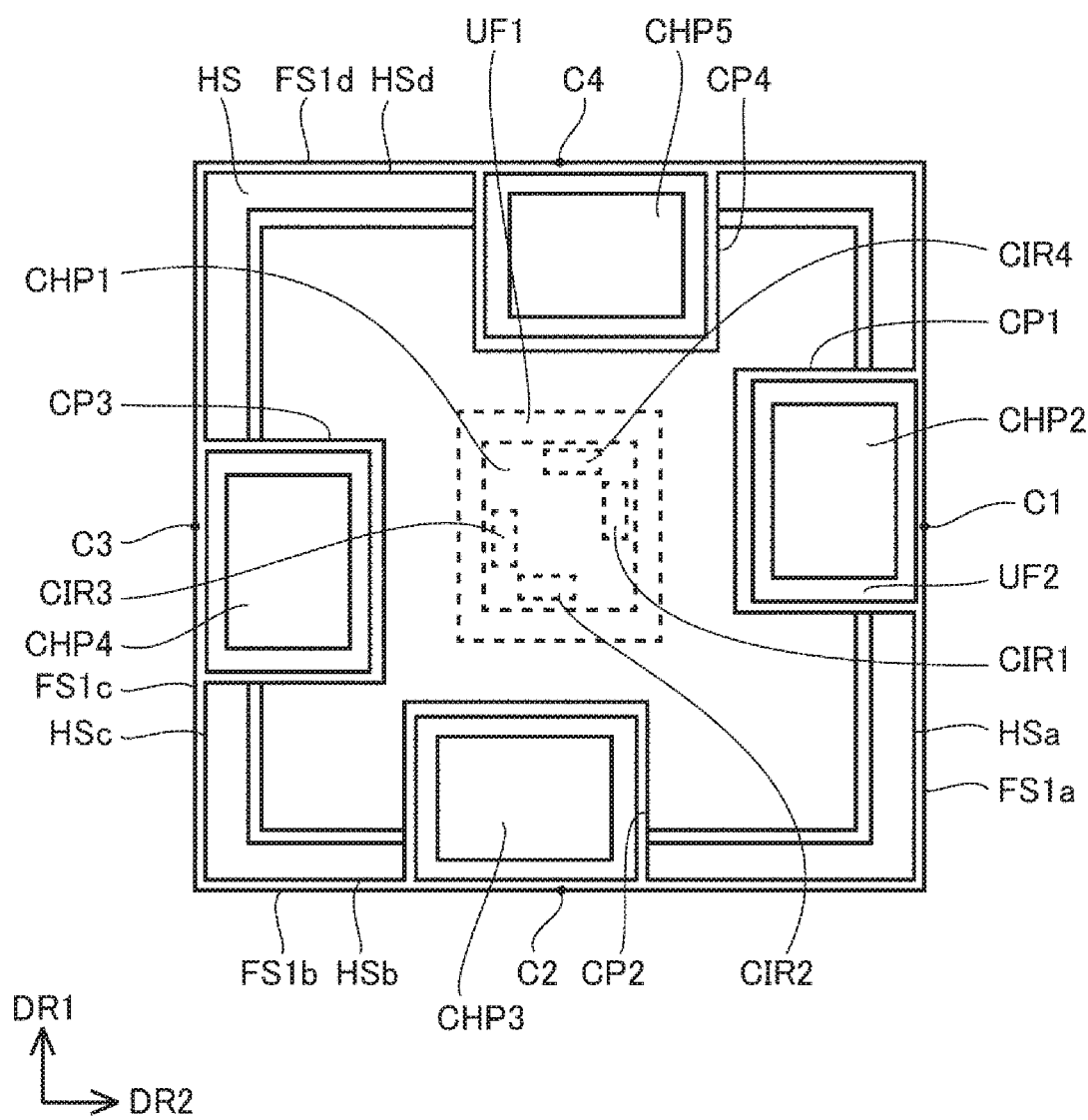
FIG. 13 is a top view of a semiconductor device according to a second embodiment.

However, as shown in FIG. 13, the configuration of the semiconductor device according to the second embodiment differs from the configuration of the semiconductor device according to the first embodiment with respect to the arrangement of the semiconductor chips CHP2 to CHP5.

The semiconductor chip CHP2 is arranged such that the center of the semiconductor chip CHP2 in the plan view is shifted from the center C1 toward the fourth side FS1d in the first direction DR1. The semiconductor chip CHP3 is arranged such that the center of the semiconductor chip CHP3 in the plan view is shifted from the center C2 toward the third side FS1c in the second direction DR2. The semiconductor chip CHP4 is arranged such that the center of the semiconductor chip CHP4 in the plan view is shifted from the center C3 toward the second side FS1b in the first direction DR1. The semiconductor chip CHP5 is arranged such that the center of the semiconductor chip CHP5 in the plan view is shifted from the center C4 toward the first side FS1a in the second direction DR2. Inside the semiconductor chip CHP1, a circuit CIR1 (an input/output circuit for the semiconductor chip CHP2) and a circuit CIR4 (an input/output circuit for the semiconductor chip CHP5) are arranged close to each other. Further, inside the semiconductor chip CHP1, a circuit CIR2 (an input/output circuit for the semiconductor chip CHP3) and a circuit CIR3 (an input/output circuit for the semiconductor chip CHP4) are arranged close to each other.

Hereinafter, effects of the semiconductor device of the second embodiment will be described. It should be noted that in the following description, points different from the effects of the semiconductor device according to the first embodiment will be mainly described, and description thereof will not be repeated.

By arranging the circuit CIR1 and the circuit CIR4 close to each other inside the semiconductor chip CHP1, synchronization of the semiconductor chip CHP2 and the semiconductor chip CHP5 is facilitated. Further, by arranging the semiconductor chip CHP2 and the semiconductor chip CHP5 close to each other corresponding to the close arrangement of the circuit CIR1 and the circuit CIR4, the signal wiring between the semiconductor chip CHP1 and an external connection electrode EL can be easily passed through the signal wiring. By arranging the circuit CIR2 and the circuit CIR3 close to each other inside the semiconductor chip CHP1, synchronization of the semiconductor chip CHP3 and the semiconductor chip CHP4 is facilitated. Further, by arranging the semiconductor chip CHP3 and the semiconductor chip CHP4 close to each other corresponding to the close arrangement of the circuit CIR2 and the circuit CIR3, the signal wiring between the semiconductor chip CHP1 and the external connection electrode EL can be easily passed through the signal wiring.

Third Embodiment

A configuration of a semiconductor device according to a third embodiment will be described below. It should be noted that in the following description, points different from the configuration of the semiconductor device according to the first embodiment will be mainly described, and description thereof will not be repeated.

The semiconductor device according to the third embodiment includes a wiring substrate PWB, a semiconductor chip CHP1, semiconductor chips CHP2 to CHP5, a heat sink HS, an adhesive member AM1, and an adhesive member AM2. The heat sink HS (third portion HS3) is bonded to at least four corners of the top surface FS1 of the heat sink HS (third portion AM1) by an adhesive member AM1. The upper surface US1 is bonded to the heat sink HS1 with an adhesive member AM2. The cut-out portion CP1 to the cut-out portion CP4 are formed in the heat sink HS. In these respects, the configuration of the semiconductor device according to the third embodiment is common to the configuration of the semiconductor device according to the first embodiment.

However, with respect to the details of the heat sink HS, the configuration of the semiconductor device according to the third embodiment is different from the configuration of the semiconductor device according to the first embodiment.

Figure 14:
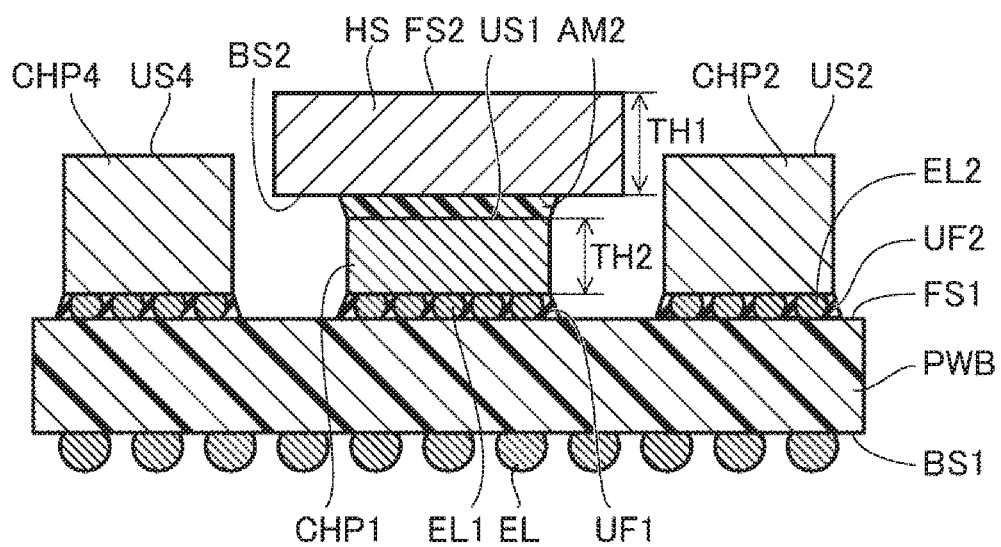
FIG. 14 is a cross-sectional view of a semiconductor device according to a third embodiment.

As shown in FIG. 14, the heat sink HS has a thickness TH1. The semiconductor chip CHP1 has a thickness TH2. The thickness TH1 is a distance between the top surface FS2 and the back surface BS2, and the thickness TH1 is a distance between the bottom surface of the semiconductor chip CHP1 and the upper surface US1 of the semiconductor chip CHP1. When the thickness TH1 (thickness TH2) differs depending on the location, the thickness TH1 (thickness TH2) is determined by the largest value thereof. The thickness TH1 is greater than the thickness TH2.

Hereinafter, effects of the semiconductor device according to the third embodiment will be described. It should be noted that in the following description, points different from the effects of the semiconductor device according to the first embodiment will be mainly described, and description thereof will not be repeated.

The warpage of the wiring substrate PWB occurs due to differences between the thermal expansion coefficient of the wiring substrate PWB and the thermal expansion coefficient of the semiconductor chip CHP1. The warpage of the wiring substrate PWB increases as the thickness TH2 of the semiconductor chip CHP1 increases. On the other hand, warpage of the wiring substrate PWB is suppressed as the thickness TH1 of the heat sink HS increases. This is because a rigidity of the heat sink HS increases as the thickness of the heat sink HS increases. Therefore, the semiconductor device according to the third embodiment can further suppress warpage of the wiring substrate PWB.

Figure 15:
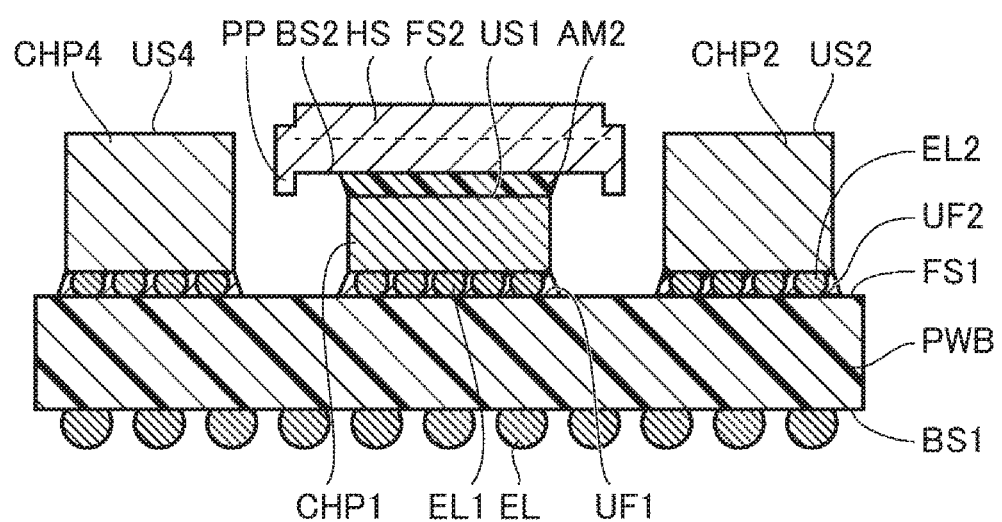
FIG. 15 is a cross-sectional view of a semiconductor device according to a modification of the third embodiment.

As shown in FIG. 15, in the semiconductor device according to the third embodiment, instead of the thickness TH1 being greater than the thickness TH2, a protruding portion PP may be formed on the heat sink HS.

The protruding portion PP is formed at an edge portion of the heat sink HS located from the cut-out portion CP1 to the cut-out portion CP4. The protruding portion PP protrudes from the back surface BS2 along a direction from the top surface FS2 toward the back surface BS2. The protruding portion PP is formed by, for example, performing a blanking process or a drawing process on the heat sink HS.

The distances between the back surface BS2 and the neutral axis of the heat sink HS (see the dotted line in FIG. 15) are locally increased in the portions where the protruding portion PP are formed. Since the rigidity of the heat sink HS increases as the distance increases, the rigidity of the heat sink HS is improved by forming the protruding portion PP, and warping of the wiring substrate PWB is further suppressed.

Fourth Embodiment

A configuration of a semiconductor device according to a fourth embodiment will be described below. It should be noted that in the following description, points different from the configuration of the semiconductor device according to the first embodiment will be mainly described, and description thereof will not be repeated.

The semiconductor device according to the fourth embodiment includes a wiring substrate PWB, a semiconductor chip CHP1, a semiconductor chip CHP2 and a semiconductor chip CHP3, a heat sink HS having the cut-out portion CP1 and the cut-out portion CP2, and an adhesive member AM1 and an adhesive member AM2.

The heat sink HS (third portion HS3) is bonded to at least four corners of the top surface FS1 of the heat sink HS by the adhesive member AM1. The upper surface US1 is bonded to the heat sink HS1 with the adhesive member AM2. That is, the semiconductor device according to the fourth embodiment is the same as the semiconductor device according to the second modification of the first embodiment in that the number of semiconductor chips arranged around the semiconductor chip CHP1 is two.

Figure 16:
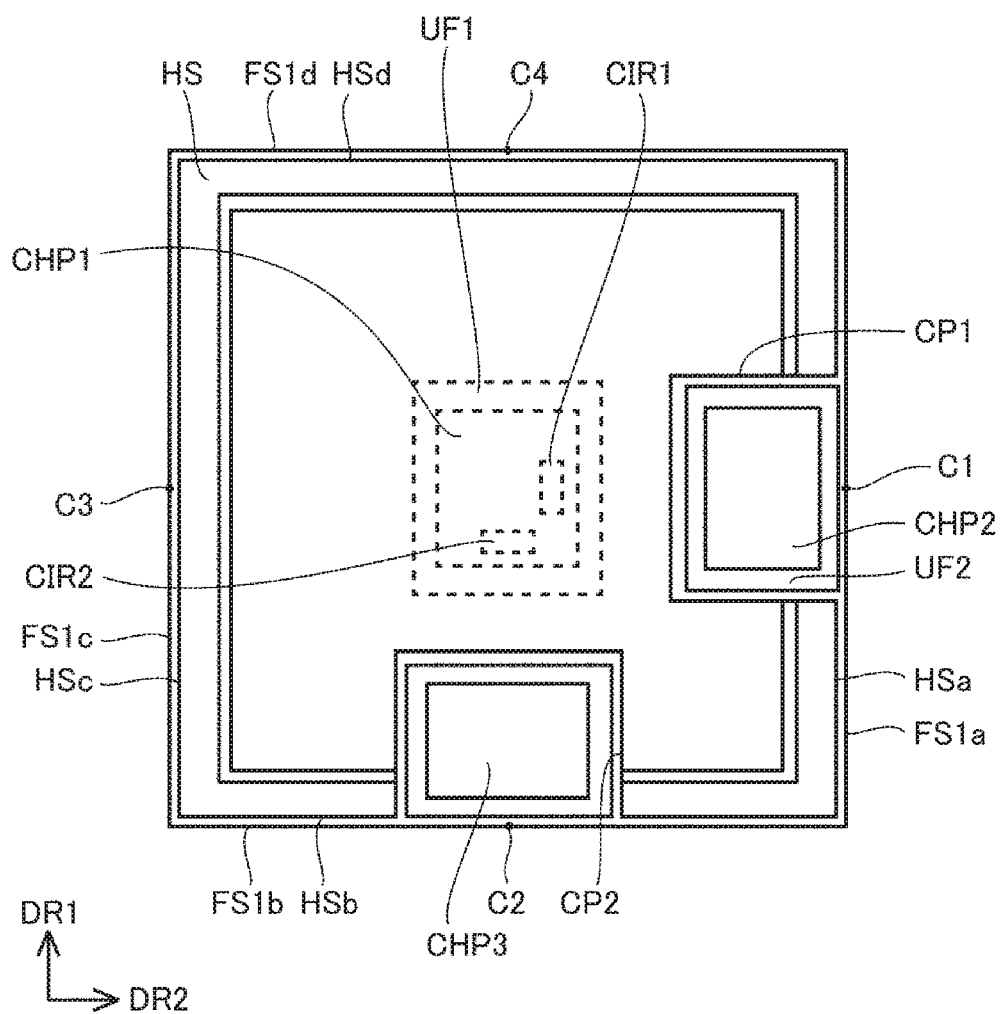
FIG. 16 is a top view of a semiconductor device according to a fourth embodiment.

However, as shown in FIG. 16, in the semiconductor device according to the fourth embodiment, two semiconductor chips (the semiconductor chip CHP2 and the semiconductor chip CHP3) arranged around the semiconductor chip CHP1 are not arranged so as to face each other with the semiconductor chip CHP1 interposed therebetween. In this respect, the configuration of the semiconductor device according to the fourth embodiment is different from the configuration of the semiconductor device according to the second modification of the first embodiment.

In the semiconductor device according to the fourth embodiment, a circuit CIR1 which is an input/output circuit for the semiconductor chip CHP2 and a circuit CIR2 which is an input/output circuit for the semiconductor chip CHP3 are formed in the semiconductor chip CHP1. The circuit CIR1 is disposed on the semiconductor chip CHP2 side (disposed opposite to the semiconductor chip CHP2) in plan view, and the circuit CIR2 is disposed on the semiconductor chip CHP3 side (disposed opposite to the semiconductor chip CHP3) in plan view.

Hereinafter, effects of the semiconductor device according to the fourth embodiment will be described. In the following description, the difference from the effect of the semiconductor device according to the second modification of the first embodiment will be mainly described, and the description will not be repeated.

In the semiconductor device according to the second modification of the first embodiment, a circuit CIR1 (see FIG. 7) and an input/output circuit (circuit CIR3, see FIG. 7) for the semiconductor chip CHP4 are formed on the semiconductor chip CHP1. In the semiconductor device according to the second modification of the first embodiment, as a result of arranging the circuit CIR1 on the semiconductor chip CHP2 side and arranging the circuit CIR3 on the semiconductor chip CHP4 side, the circuit CIR1 and the circuit CIR3 are arranged relatively apart from each other.

In the semiconductor device according to the fourth embodiment, the two semiconductor chips (the semiconductor chip CHP2 and the semiconductor chip CHP3) arranged around the semiconductor chip CHP1 are arranged as described above, and as a result, the input/output circuits (the circuit CIR1 and the circuit CIR2) with respect to them are arranged relatively close to each other. Therefore, according to the semiconductor device of the fourth embodiment, two semiconductor chips arranged around the semiconductor chip CHP1 can be easily operated in synchronization with each other.

Semiconductor Device According to a Modification of the Fourth Embodiment

Figure 17:
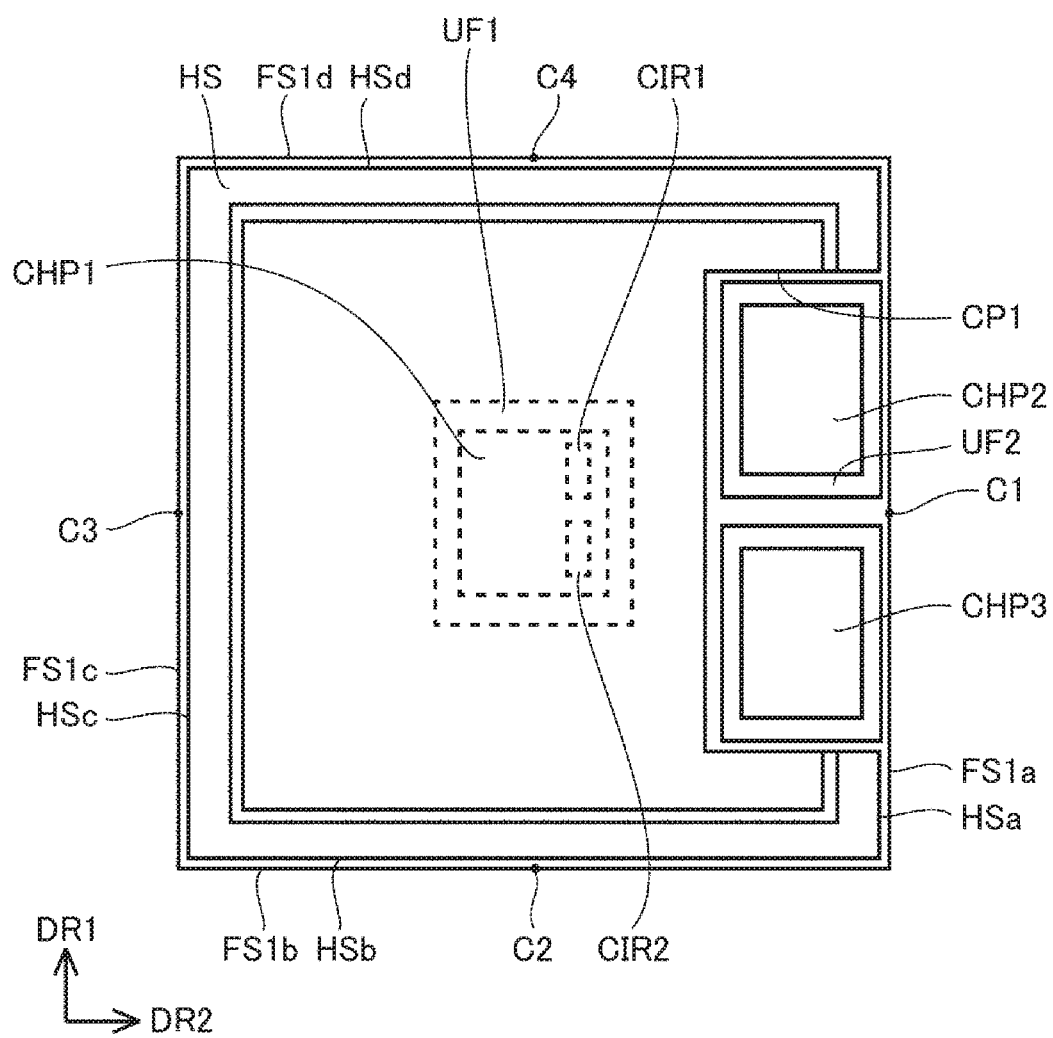
FIG. 17 is a to view of a semiconductor device according to a modification of the fourth embodiment.

As shown in FIG. 17, the semiconductor chip CHP2 and the semiconductor chip CHP3 may be disposed between the semiconductor chip CHP1 and the first side FS1a. The cut-out portion CP2 may not be formed in the heat sink HS. Instead, the cut-out portion CP1 is formed on the heat sink HS so as to overlap the semiconductor chip CHP2 and the semiconductor chip CHP3 in plan view.

Since the circuit CIR1 and the circuit CIR2 can be disposed on the same side of the semiconductor chip CHP1, i.e., the circuit CIR1 and the circuit CIR2 can be disposed closer to each other, two semiconductor chips disposed around the semiconductor chip CHP1 can be easily operated in synchronization with each other.

Although the invention made by the present inventor has been specifically described based on the embodiment, the present invention is not limited to the embodiment described above, and it is needless to say that various modifications can be made without departing from the gist thereof.

What is claimed is:

1. A semiconductor device, comprising:
    a wiring substrate having a first surface;
    a first semiconductor chip and a second semiconductor chip disposed on the first surface; and
    a heat sink having a second surface which faces the first surface and a third surface opposite the second surface, and disposed over the first surface such that the heat sink is disposed on the first semiconductor chip,
    wherein the heat sink has a first cut-out portion which is formed at a position overlapping the second semiconductor chip in plan view,
    wherein the first cut-out portion penetrates the heat sink plate in a direction from the third surface toward the second surface, and
    wherein the second surface of the heat sink is bonded to at least four corners of the first surface of the wiring substrate.

2. The semiconductor device of claim 1,
    wherein the first semiconductor chip has a first upper surface opposite the first surface of the wiring substrate,
    wherein the second semiconductor chip has a second upper surface opposite the first surface of the wiring substrate, and
    wherein the second upper surface is located farther from the first surface of the wiring substrate than the first upper surface of the first semiconductor chip.

3. The semiconductor device according to claim 2, further comprising:
    a first adhesive member bonding the first surface of the wiring substrate and the second surface of the heat sink; and
    a second adhesive member bonding the first upper surface of the first semiconductor chip and the second surface of the heat sink,
    wherein a thermal conductivity of the second adhesive member is greater than a thermal conductivity of the first adhesive member.

4. The semiconductor device of claim 3,
    wherein the second upper surface of the second semiconductor chip is located farther from the first surface of the wiring substrate than the second surface of the heat sink bonded to the first upper surface of the first semiconductor chip.

5. The semiconductor device according to claim 4,
    wherein the first semiconductor chip is a bare chip and the second semiconductor chip is sealed with resin.

6. The semiconductor device according to claim 5,
    wherein a logic circuit is formed in the first semiconductor chip and a memory circuit is formed in the second semiconductor chip.

7. The semiconductor device according to claim 6,
    wherein an amount of heat generated by the first semiconductor chip is greater than an amount of heat generated by the second semiconductor chip.

8. The semiconductor device of claim 1,
    wherein a thickness of the heat sink is greater than a thickness of the first semiconductor chip.

9. The semiconductor device according to claim 1,
    wherein a protruding portion protrudes from the second surface along a direction from the third surface toward the second surface is formed on an edge portion of the heat sink on the first cut-out portion side.

10. The semiconductor device according to claim 1, further comprising:
    a third semiconductor chip disposed on the first surface;
    wherein the heat sink further comprises a second cut-out portion;
    wherein the second cut-out portion is formed at a position overlapping the third semiconductor chip in plan view; and penetrates the heat sink in a direction from the third surface toward the second surface.

11. The semiconductor device according to claim 10,
wherein the first surface includes a first side extending in a first direction and a second side extending in a second direction intersecting the first direction,
wherein the second semiconductor chip is disposed between the first side and the first semiconductor chip in plan view, and
wherein the third semiconductor chip is disposed between the second side and the first semiconductor chip in plan view.

12. The semiconductor device according to claim 11,
wherein the first surface further includes a third side extending in the first direction and facing the first side, and a fourth side extending in the second direction and facing the second side,
wherein the second semiconductor chip is disposed at a position shifted from the center of the first side to the fourth side in the first direction, and
wherein the third semiconductor chip is disposed at a position shifted from the center of the second side to the third side in the second direction.

13. The semiconductor device according to claim 11,
wherein the first surface further includes a third side extending in the first direction and facing the first side, and a fourth side extending in the second direction and facing the second side,
wherein the heat sink has, in plan view, a fifth side along the first side, a sixth side along the second side, a seventh side along the third side, and an eighth side along the fourth side, and
wherein a distance between an end on the third side of the second semiconductor chip and an end on the seventh side of the first cut-out portion is greater than a distance between the fifth side and the first side.

14. The semiconductor device according to claim 1, further comprising:
a fourth semiconductor chip disposed on the wiring substrate;
wherein the heat sink further comprises a third cut-out portion,
wherein the third cut-out portion is formed at a position overlapping the fourth semiconductor chip in plan view, and penetrates the heat sink in a direction from the third surface toward the second surface,
wherein the first surface includes a first side extending in a first direction; a third side extending in the first direction and opposite the first side;
wherein the second semiconductor chip is disposed between the first side and the first semiconductor chip in plan view; and
wherein the fourth semiconductor chip is disposed between the third side and the first semiconductor chip in plan view.

15. The semiconductor device according to claim 1, further comprising:
a third semiconductor chip disposed on the first surface;
wherein the first surface includes a first side extending in a first direction; and
wherein the first cut-out portion is formed so as to overlap the second semiconductor chip and the third semiconductor chip in plan view.

\* \* \* \* \*